(12) United States Patent
Semmler et al.

(10) Patent No.: US 6,720,896 B2
(45) Date of Patent: Apr. 13, 2004

(54) ANALOG/DIGITAL OR DIGITAL/ANALOG CONVERTER HAVING INTERNAL REFERENCE VOLTAGE SELECTION

(75) Inventors: Joseph Semmler, Villach (AT); Frank Lehmacher, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/067,173

(22) Filed: Feb. 4, 2002

(65) Prior Publication Data

US 2002/0126033 A1 Sep. 12, 2002

Related U.S. Application Data

(63) Continuation of application No. PCT/DE00/02565, filed on Aug. 2, 2000.

(30) Foreign Application Priority Data

Aug. 2, 1999 (DE) .......................................... 199 36 327

(51) Int. Cl.[7] .............................. H03M 1/10; H03M 1/78
(52) U.S. Cl. ....................................... 341/120; 341/154
(58) Field of Search ............................... 341/118, 120, 341/141, 150, 154, 172, 167; 327/337; 330/9; 375/345; 323/313, 317

(56) References Cited

U.S. PATENT DOCUMENTS

| | | | |
|---|---|---|---|
| 4,399,426 A | | 8/1983 | Tan |
| 4,453,258 A | * | 6/1984 | Richardson ................ 375/345 |
| 4,700,174 A | * | 10/1987 | Sutherland et al. ......... 341/120 |
| 4,701,694 A | * | 10/1987 | Penney et al. .............. 323/317 |
| 4,849,757 A | * | 7/1989 | Krenik ........................ 341/167 |
| 4,970,514 A | * | 11/1990 | Draxelmayr ................ 341/120 |
| 4,990,913 A | * | 2/1991 | Beauducel .................. 341/139 |
| 5,157,400 A | * | 10/1992 | Bang .......................... 341/166 |
| 5,638,072 A | * | 6/1997 | Van Auken et al. ........ 341/141 |
| 5,646,515 A | * | 7/1997 | Mayes et al. ............... 323/313 |
| 5,825,316 A | | 10/1998 | Kuttner |
| 5,852,415 A | * | 12/1998 | Cotter et al. ................ 341/120 |
| 6,087,897 A | * | 7/2000 | Wang ............................ 330/9 |
| 6,194,946 B1 | * | 2/2001 | Fowers ....................... 327/337 |
| 6,268,813 B1 | * | 7/2001 | de Wit ........................ 341/120 |
| 6,348,885 B1 | * | 2/2002 | Munoz et al. .............. 341/120 |
| 6,411,233 B1 | * | 6/2002 | Sutardja ..................... 341/120 |

FOREIGN PATENT DOCUMENTS

| | | |
|---|---|---|
| DE | 42 23 000 C2 | 1/1994 |
| DE | 195 12 495 C1 | 8/1996 |
| EP | 0 320 642 A1 | 6/1989 |
| EP | 937988 | * 11/1998 |
| EP | 0 930 716 A2 | 7/1999 |

OTHER PUBLICATIONS

Michael Cooperman et al.: "Charge distribution Codec", *IEEE Journal of Solid–State Circuits*, vol. SC–16, No. 3, Jun. 1981, pp. 155–163.

* cited by examiner

*Primary Examiner*—Patrick Wamsley
(74) *Attorney, Agent, or Firm*—Laurence A. Greenberg; Werner H. Stemer; Ralph E. Locher

(57) ABSTRACT

An A/D converter or D/A converter has an internal voltage selection device. Several reference voltages are available for selection by the selection device, which selects a voltage based on a selection signal and feeds the reference voltage to a conversion device of the converter. A correction network is provided for correcting offset and linearity errors. The plurality of reference voltages are freely selectable reference voltages, and the specific reference voltage defining the conversion is freely selectable, that is, it is freely selectable what reference voltage is used to carry out a respective conversion.

23 Claims, 2 Drawing Sheets

US 6,720,896 B2

ANALOG/DIGITAL OR DIGITAL/ANALOG CONVERTER HAVING INTERNAL REFERENCE VOLTAGE SELECTION

CROSS-REFERENCE TO RELATED APPLICATION

This application is a continuation of copending International Application PCT/DE00/02565, filed Aug. 2, 2000, which designated the United States.

BACKGROUND OF THE INVENTION

Field of the Invention

The present invention relates to an analog/digital or a digital/analog converter. The device has a conversion device for converting an analog or digital input signal into a digital or analog output signal with respect to a specific reference voltage. The converter has an internal reference voltage selection device, to which a plurality of reference voltages are applied and which, depending on a selection signal, selects one of the reference voltages and applies the same to the conversion device.

In electronic metrology, i.e., electronic measurement technology, circuits in which a plurality of selectable reference voltages must be used (for example in the case of multi-channel ratiometric measurements in which the ratios of a plurality of voltages relative to one another are to be determined) have hitherto been constructed in a relatively complicated manner.

Conventional A/D or D/A converters, however, are provided with only one reference voltage input. In order to be able to carry out such ratiometric measurements (e.g. the comparison of two sensor voltages) with A/D converters having only one reference voltage input, at least two separate measurements and also subsequent formation of the ratio between the digital conversion results of the A/D converter are necessary. By contrast, if a plurality of freely selectable reference voltage inputs were present, the same ratiometric measurement could be handled in just a single measurement step, since one of the two sensor voltages could be used as reference voltage and the other sensor voltage could be used as analog voltage to be converted.

Conventional A/D and D/A converters can be operated with a plurality of reference voltages only when an external changeover of the reference voltage respectively supplied is provided, as a result of which, however, the accuracy is generally reduced.

Although a few cases of A/D converters which can internally alter the reference voltage respectively used by means of a resistor divider have already been disclosed, these A/D converters have the disadvantage that the reference voltage is loaded with a permanent direct current, this being the case in particular even when no A/D conversion is currently in progress.

Furthermore, the ratiometric measurements described above are not possible, even with A/D converters of this type. Moreover, these A/D converters are not calibratable, i.e. simultaneous correction of linearity and/or offset errors with the aid of a calibration operation is not possible. However, the accuracy of an A/D or D/A conversion is critically determined by linearity and offset errors which are caused by a mismatch of different circuit sections. In sensor technology, in particular, the signal voltages to be processed are very small, so that precisely in this area of application, high demands are placed on the accuracy of the A/D and D/A converters in order that corruption of the measurement results can be avoided or at least suppressed. In order to be able to comply with the rising accuracy requirements made of an A/D or D/A conversion, therefore, calibratable A/D or D/A converters and also powerful calibration methods are necessary, so that the errors caused by a mismatch can be compensated.

A/D and D/A converters with self-calibration are already widely known. Commonly assigned U.S. Pat. No. 5,825,316 (German patent DE 195 12 495 C1), for example, describes an A/D converter in which the conversion of an analog input signal into a digital output signal is performed according to the principle of charge redistribution and successive approximation. The principle of charge redistribution with successive approximation is also described in detail for example in U.S. Pat. No. 4,399,426 and also in "All-MOS Charge Redistribution Analog-to-Digital Conversion Techniques Part I", James L. McCreary and Paul R. Gray, IEEE Journal of Solid State Circuits, December 1975 pages 371-79. The A/D converter accordingly comprises a main network, serving for the A/D conversion with a plurality of reference elements, in particular capacitors, whose capacitances are selected in a weighted manner. Furthermore, a correction network with likewise weighted capacitors is provided, which generates correction voltages for the correction of offset and/or linearity errors which are fed into the main network.

However, even in these known A/D and D/A converters with self-calibration, the use of a plurality of different reference voltages is not known, i.e. the reference voltage is constant throughout operation. The reference voltage cannot be changed between individual conversions. This also means, however, that a calibration which possibly precedes a conversion, the conversion itself and a calibration which possibly succeeds the conversion are carried out with the same reference voltage. A calibrating A/D or D/A converter with a reference voltage which can be selected for each conversion is not known.

SUMMARY OF THE INVENTION

It is accordingly an object of the invention to provide an A/D converter or a D/A converter, which overcomes the above-mentioned disadvantages of the heretofore-known devices and methods of this general type and thus to provide an A/D or D/A converter whose reference voltage can be freely selected, even during operation. In particular, the present invention is based on the object of proposing a calibratable A/D or D/A converter of this type.

With the foregoing and other objects in view there is provided, in accordance with the invention, an analog/digital or digital/analog converter, comprising:

a conversion device for converting an analog input signal into a digital output signal, or converting a digital input signal into an analog output signal, with respect to a specific reference voltage;

the conversion device having an internal reference voltage selection device connected to receive a plurality of reference voltages and configured to select, in dependence on a selection signal, one of the reference voltages and apply the selected reference voltage to the conversion device; and wherein the plurality of reference voltages are freely selectable reference voltages, and the specific reference voltage defining the conversion is freely selectable.

In other words, the A/D or D/A converter has an integrated internal selection device to which different reference voltages are fed and which selects one of these reference voltages for the A/D or D/A conversion depending on a control signal. This internal selection device may be configured in particular in the form of an analog multiplexer which can be driven via a data bus with the control signal. In this case, the changeover of the reference voltage that is respectively to be used is effected by transmission gates, so that the reference voltages are not additionally loaded by the changeover operation.

In a preferred exemplary embodiment, the A/D or D/A converter according to the invention comprises a correction or calibration circuit which is suitable, on the one hand, for operation with different freely selectable reference voltages and, on the other hand, for both offset and linearity calibration. The calibration circuit comprises, in particular, a plurality of weighted reference elements, for example capacitors, resistors or transistors, those reference elements at which the positive reference voltage is present during the zero point respectively selected being provided twice, namely once for the offset calibration and once for the linearity calibration. In the context of the present invention, a specific procedure is proposed with regard to the application of the different voltages to the reference elements of the calibration circuit, resulting in the possibility of reliable compensation of both offset and linearity errors using one and the same calibration circuit with the simultaneous use of a plurality of freely selectable reference voltages.

In accordance with an added feature of the invention, the conversion device comprises a main network with a plurality of weighted reference elements and an output, and a comparator connected to the output of the main network, and a correction network with weighted further reference elements is coupled to the main network for correcting offset errors and linearity errors, and wherein the reference elements of the main network are assigned correction values for driving the correction network.

In accordance with an additional feature of the invention, the main network is configured to convert the input signal according to the principle of charge redistribution, and the weighted reference elements in the main network and the correction network are capacitors.

In accordance with another feature of the invention, a main network controller sets a voltage to be applied in each case to the reference elements of the main network, and a correction network controller sets a voltage to be applied in each case to the reference elements of the correction network.

In accordance with a further feature of the invention, at least one reference voltage of the plurality of reference voltages applied to the reference voltage selection device is a temporally constant reference voltage, and the correction network controller applies the temporally constant reference voltage to the correction network as a base reference voltage for correcting offset errors and linearity errors.

In accordance with again an added feature of the invention, the correction network is allocated a specific zero point at which the correction network controller applies in each case either the base reference voltage or a negative reference voltage to the individual weighted reference elements of the correction network.

In accordance with again an additional feature of the invention, all the reference elements of the correction network to which the base reference voltage is applied at the zero point are divided into a corresponding offset reference element for correcting offset errors and into a corresponding linearity reference element for correcting linearity errors.

In accordance with again another feature of the invention, the zero point of the correction network is defined such that the base reference voltage is applied only to a most significant reference element of the correction network by the correction network controller at the zero point, while the negative reference voltage is applied to all other reference elements of the correction network at the zero point.

In accordance with again a further feature of the invention, the correction network controller, for a correction of offset errors, fixedly applies the base reference voltage to the linearity reference element, while in a sample phase of the comparator, the base reference voltage or the negative reference voltage is applied to the offset reference element and the other reference element of the correction network depending on a previously determined offset correction value, and, in a decision phase of the comparator the base reference voltage is applied to the at least one offset reference element and the negative reference voltage is applied to the other reference elements of the correction network, the comparator storing the voltage present at a node between the main network and the correction network in the sample phase and converting the voltage into a new offset correction value in the decision phase.

In accordance with yet again a further feature of the invention, the correction network controller, for a correction of linearity errors, in a sample phase of the comparator applies the base reference voltage or the negative reference voltage to the offset reference element and the other reference elements of the correction network depending on a previously determined offset correction value and applies the base reference voltage to the linearity reference element, while in a decision phase of the comparator, the base reference voltage is applied to the offset reference element and either the base reference voltage or the negative reference voltage is applied to the linearity reference element and also the other reference elements of the correction network depending on a previously determined linearity correction value, and wherein the comparator stores a voltage present at a node between the main network and the correction network in the sample phase and converts the voltage into a new linearity correction value in the decision phase.

Finally, in accordance with a concomitant feature of the invention, the main network is configured to convert the input signal according to the principle of charge redistribution, and the weighted reference elements in the main network and the correction network are capacitors, the correction network controller is configured to, during a conversion of the converter, in a sample phase thereof, apply either the base reference voltage or the negative reference voltage to the offset reference element and the other reference elements of the correction network depending on a previously determined offset correction value and to apply a reference voltage, which is instantaneously selected by the reference voltage selection device, to the linearity reference element, while in a subsequent charge redistribution phase of the converter, the base reference voltage is applied to the at least one offset reference element and either the reference voltage, which is instantaneously selected by the reference voltage selection device, or the negative reference voltage is applied to the linearity reference element and also the other reference elements of the correction network depending on a previously determined linearity correction value.

Other features which are considered as characteristic for the invention are set forth in the appended claims.

Although the invention is illustrated and described herein as embodied in a analog/digital or digital/analog converter, which, in principle, can be applied to both A/D and D/A converters (for example in microcontrollers), it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
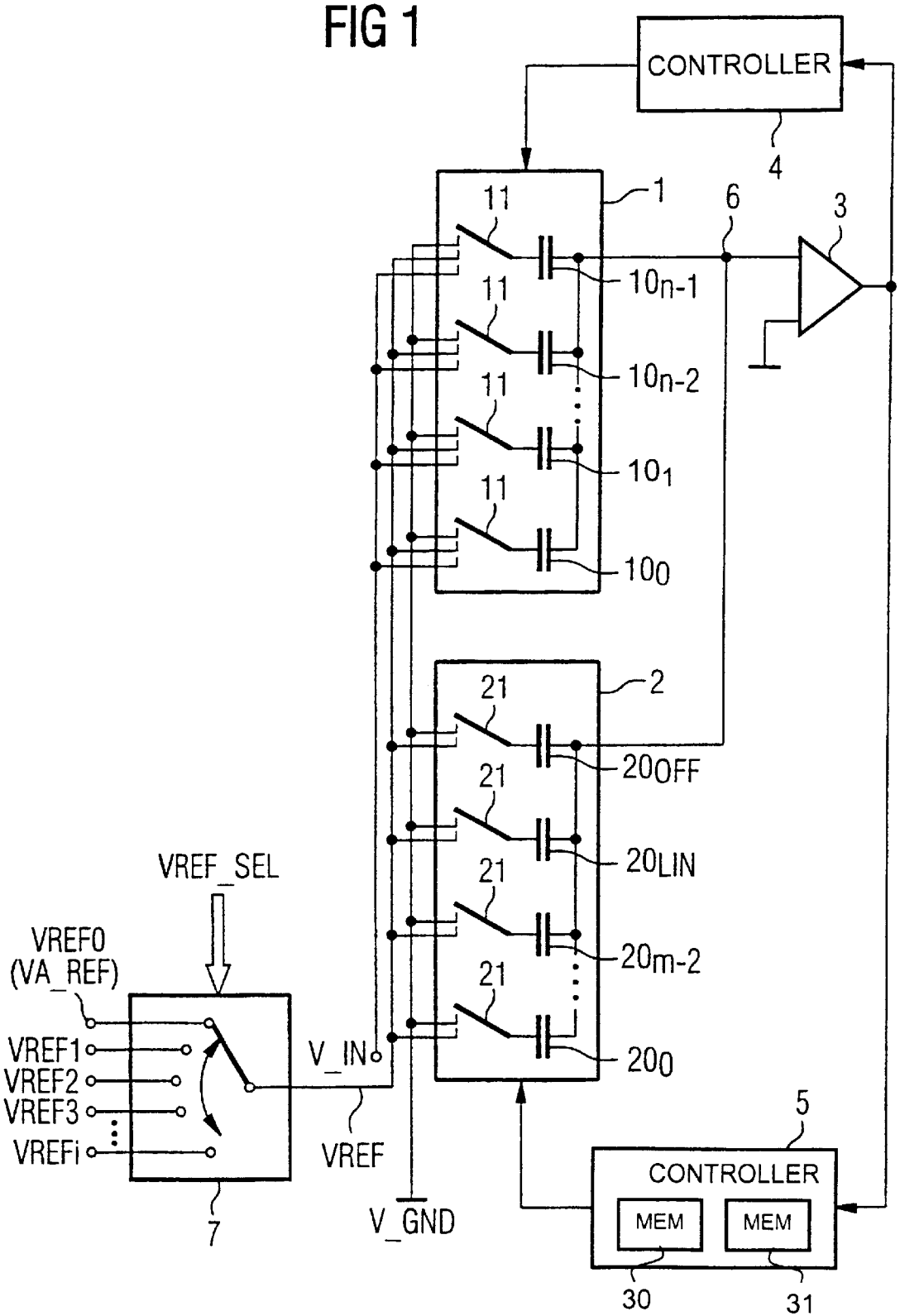
FIG. 1 is a schematic block diagram of an exemplary embodiment of an A/D converter according to the invention which is operated according to the principle of charge redistribution and successive approximation.

Referring now to the figures of the drawing in detail and first, particularly, to FIG. 1 thereof, the analog/digital (A/D) converter shown therein serves for converting an analog input voltage signal V_IN into a corresponding digital output signal. For this purpose, the A/D converter comprises a main network 1 with a multiplicity of reference elements, in the present case capacitors $10_{n-1} \ldots 10_0$, whose capacitances are binary weighted, the capacitance of the capacitor $10_{n-i}$ corresponding to the sum of the capacitances of the less significant capacitors $10_{n-i-2} \ldots 10_0$. In this case, given an n-bit converter, the capacitor $10_{n-1}$ corresponds to the most significant capacitor, while the capacitor $10_0$ corresponds to the least significant capacitor. However, the reference elements could also be, for example, resistors with correspondingly weighted resistances. At a node 6, a calibration or correction network 2 is connected to the main network 1, which correction network applies a correction voltage for the compensation of offset and linearity errors to the node 6. The signal present at the node 6 is compared with the ground potential or another reference voltage in a comparator 3 and, depending on this, the digital output signal is generated and a controller 4 for the main network 1 or a controller 5 for the correction network 2 is driven.

The individual capacitors of the main network 1 can optionally be connected to a negative reference voltage or the ground potential VA_GND, a positive reference voltage VREF or the input signal V_IN via controllable switches 11. The control of the switches 11 and the evaluation—dependent thereon—of the voltage signal at the node 6 is carried out by the controller 4. The conversion of the analog input signal V_IN into the digital output signal which is present in the controller 4 is effected according to the principle of charge redistribution and successive approximation, as is described in detail for example in "All-MOS Charge Redistribution Analog-to-Digital Conversion Techniques Part I", James L. McCreary and Paul R. Gray, IEEE Journal of Solid State Circuits, December 1975, pages 371-79. For this purpose, the weighted capacitors $10_{n-1} \ldots 10_0$ of the main network 1 are firstly connected to the analog input signal V_IN during a sample phase, the node 6 being grounded. Afterward, the individual switches 11 are successively switched by the controller 4 in such a way that each capacitor $10_{n-1} \ldots 101_0$ is connected both to the reference voltage VREF and to the ground potential V_GND (charge redistribution phase). Depending on the comparison results in the comparator 3, the digital value which then results therefrom is stored in a register of the controller 4.

The reference voltage VREF is provided by an internal selection device 7, which enables a freely selectable reference voltage for each conversion. The selection device 7 may be configured in particular in the form of an analog multiplexer 7 which is part of the A/D converter and to which a plurality of different reference voltages VREF0 . . . VREFi are applied. The individual reference voltages can be selected with the aid of the multiplexer 7 by multiplexing digitally via a data bus VREF_SEL. The bus width of the data bus depends on the number of different selectable reference voltages VREF0 . . . VREFi.

As mentioned above, the calibration network 2, likewise shown in FIG. 1, serves for the correction of linearity and offset errors by applying corresponding correction voltages to the node 6. The calibration network 2 also comprises weighted reference elements 20 (capacitors, in the present case), which can optionally be connected to VREF or V_GND in each case via controllable switches 21. The controller 5 comprises a memory 30, in which a corresponding correction value for the correction of linearity errors is stored for each of the reference elements 20. A memory 31 for storing correction values for the correction of offset errors is analogously provided. These correction values stored in the memories 30 and 31 ensure that when, for the successive approximation, one of the capacitors 10 of the main network is activated for the comparison operation, a correction signal generated by the calibration network 2 is fed in at the node 6, so that the respective linearity or offset error to be compensated of the respective capacitor 10 of the main network 1 is compensated. The requisite switch positions of the switches 21 are defined by the controller 5 in a manner dependent on the correction value respectively stored.

Before the special features of the present invention are discussed with respect to the calibration network 2 shown in FIG. 1, to provide a better understanding the essential relationships of the self-calibration when using a single constant reference voltage will be explained with reference to FIG. 2, the same reference symbols as in FIG. 1 being used in FIG. 2 for the mutually corresponding component parts.

Figure 2:
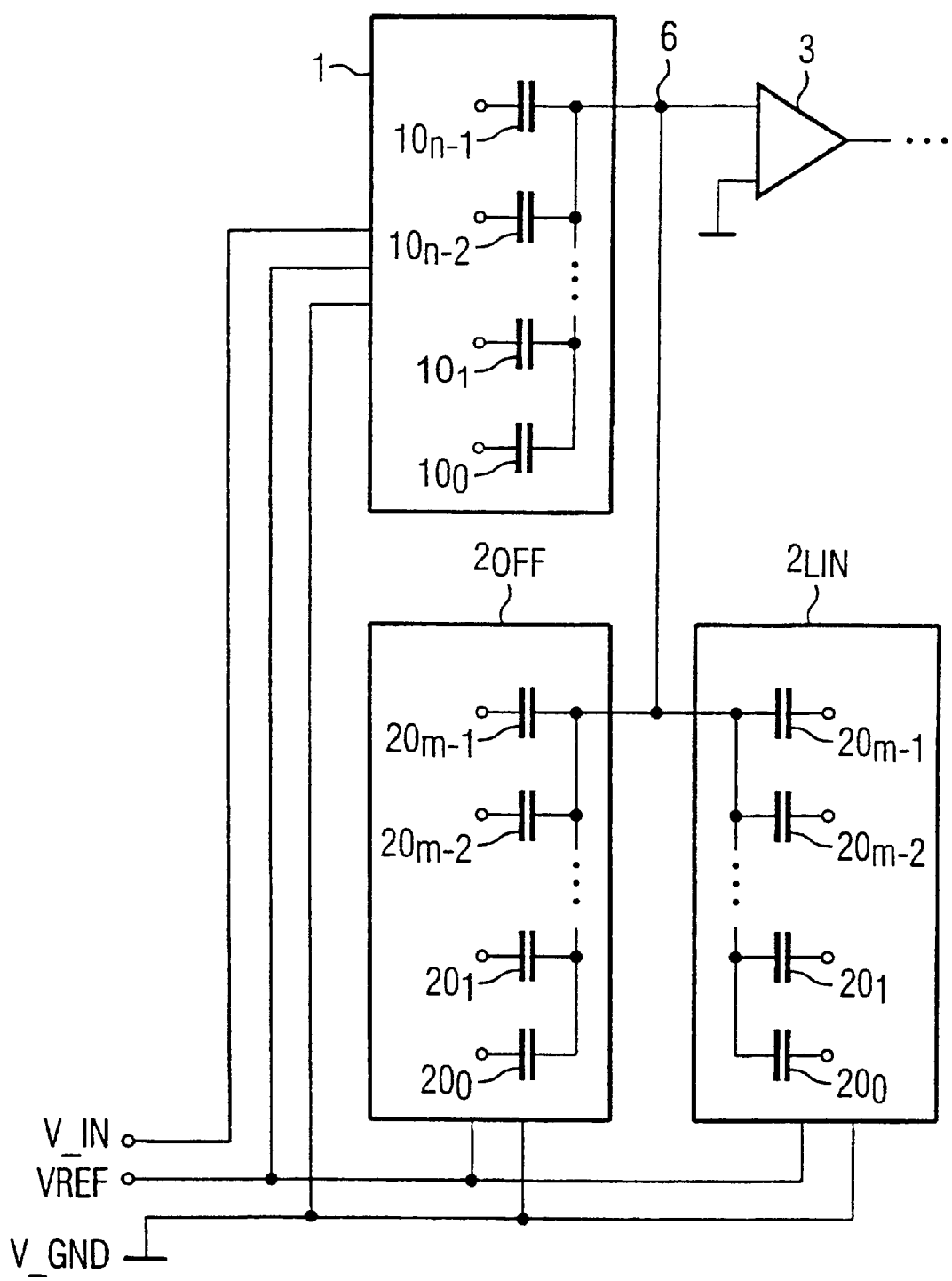
FIG. 2 is a schematic block diagram elucidating the compensation of offset and linearity errors in accordance with the prior art.

In this case, FIG. 2 illustrates an A/D converter with two separate calibration networks $2_{OFF}$ and $2_{LIN}$. The calibration network $2_{OFF}$ serves exclusively for the compensation of offset errors, while the calibration network $2_{LIN}$ is provided exclusively for the compensation of linearity errors. Like the main network 1, both calibration networks $2_{OFF}$ and $2_{LIN}$ comprise binary-weighted reference elements, capacitors $20_{m-1} \ldots 20_0$ in the present case. Both in the main network 1 and in the calibration networks $2_{OFF}$ and $2_{LIN}$, the capacitance of the capacitor $10_{n-i}$ and $20_{m-i}$, respectively, in each case corresponds to the sum of the capacitances of the less significant capacitors $10_{n-i-1} \ldots 10_0$ or $20_{m-i-1} \ldots 20_0$, respectively. This property can be utilized for the determination of the errors of all the reference elements or capacitors $10_{n-i} \ldots 10_0$ of the main network 1 as follows.

If the positive reference voltage VREF is applied to the capacitor $10_i$ respectively examined (which is equivalent to the setting of the bit i), and if the negative reference voltage V_GND is applied to all the less significant capacitors $10_j$ (j<i) (i.e. the bit j is not set) and then the switch configuration is interchanged (i.e. VREF applied to $10_j$ and V_GND to $10_i$), a voltage jump occurs at the node 6, which voltage jump is zero in the case of an ideal, error-free network. By contrast in the case of a real, error-afflicted network, a voltage jump>zero occurs, which is a measure of the error of the capacitor $10_i$ respectively examined. A correction voltage which compensates for the error of the capacitor $10_i$ can be applied to the node 6 via the calibration networks $2_{OFF}$ and $2_{LIN}$, which function as D/A converters.

Since a distinction is made between offset and linearity errors, the separate calibration networks $2_{OFF}$ and $2_{LIN}$ shown in FIG. 2 are often used in conventional A/D converters.

During the offset calibration, the capacitors of the main network 1 and of the calibration network $2_{LIN}$ are not changed over. The comparator 3 is firstly switched into the sample mode, so that the comparator 3 stores the voltage present at the node 6. At the same time, the offset correction value determined according to the preceding conversions is applied to the offset calibration network $2_{OFF}$ in the form of a digital data word of width m (a binary '1' corresponds to the applied voltage VREF, and a binary '0' corresponds to the applied voltage V_GND). Finally, the comparator is changed over into the conversion mode and the offset calibration network $2_{OFF}$ is switched into its zero point, in which case the zero point may be chosen for example in such a way that only the most significant bit n-1 is put at '1'. The voltage at the capacitors 10 of the main network 1 furthermore remains unchanged. Depending on the comparator result, the applied offset correction value is then increased or decreased and stored as new offset correction value, so that a continuous approximation to the final offset correction value is effected.

The linearity calibration is effected in a similar manner to the offset calibration, but in this case both the main network 1 and the two calibration networks $2_{OFF}$ and $2_{LIN}$ are active. By way of example, if the most significant bit of the main network 1, i.e. the capacitor $10_{n-1}$, is to be calibrated, the comparator is firstly switched into the sample mode, and the previously determined offset correction value is applied to the offset calibration network $2_{OFF}$ in order to eliminate the offset during this measurement. By contrast, the calibration network $2_{LIN}$ is switched into its zero point ('1000 . . . 000') and the main network 1 is put at '0111 . . . 111'. Afterward, the comparator 3 is switched over into the conversion mode and the main network 1, after the conversion, is put at '1000 . . . 000'. For the correction of the offset error, the offset calibration network $2_{OFF}$ is switched back into its zero point ('1000 . . . 000'), while for the correction of the linearity error, the linearity calibration network $2_{LIN}$ is switched from its zero point to the linearity correction value determined last (in the form of a digital data word of width m). Depending on the comparator result, the linearity error determined according to the preceding conversions or the corresponding correction value is then increased or decreased and stored as new correction value in the corresponding memory, so that the present correction value converges toward its final value. This procedure is repeated for all the other bits or capacitors of the main network 1.

In normal operation, i.e. during an A/D conversion, in the sample phase the offset correction value is present at the offset calibration network $2_{OFF}$ and the linearity zero point is present at the linearity calibration network $2_{LIN}$, while in the charge redistribution phase, the offset zero point is present at the offset calibration network $2_{OFF}$ and the linearity correction value corresponding to the set capacitors of the main network 1 is present at the linearity calibration network $2_{LIN}$.

In the present example, the value '1000 . . . 000' (2's complement representation) was chosen as the zero point in order to be able to map both positive and negative correction values by means of the offset and linearity calibration networks $2_{OFF}$ and $2_{LIN}$, respectively. Since both the offset calibration and the linearity calibration use the same zero point, the effects of the calibration networks can be superposed. Moreover, the tasks of the two calibration networks could also be implemented by a single calibration network.

If the two calibration networks shown in FIG. 2 are combined to form a common calibration network, the above-described method of offset calibration does not change, in principle. For the linearity calibration, by contrast, the offset correction value is applied in this case to the calibration network in the sample phase of the comparator 3, while the linearity correction value is applied in the charge redistribution phase.

The above considerations respectively relate to the case of using a single reference voltage VREF as illustrated in FIG. 2. If different reference voltages are used, by contrast, as is proposed, in the context of the present invention, the problem arises that the offset correction values determined in the course of the calibration method are absolute values and in each case depend on the reference voltage on which the calibration is based. This dependence must be compensated for by circuitry for a conversion carried out with a different reference voltage, since otherwise the correction values are afflicted by errors. Linearity errors, by contrast, as has already been explained, can be attributed to mismatches and are thus ratio values which do not depend on the reference voltage.

In principle, the combined calibration network described above would also be suitable for operation with a plurality of freely selectable reference voltages if a calibration is carried out completely anew each time the reference voltage is changed. This solution is unsuitable in practice, however, since, on the one hand, on account of interference immunity, the largest possible reference voltage should always be used for calibration, and, on the other hand, the time required in the changeover of the reference voltage for the recalibration is in most cases a multiple of the conversion duration.

Therefore, the exemplary embodiment shown in FIG. 1 comprises a calibration network 2 which is provided for the compensation both of linearity errors and of offset errors and contains a circuitry modification such that, in conjunction with a reduced area requirement reliable error compensation is possible, even with the use of a plurality of freely selectable reference voltages. It is assumed below that at least one of the freely selectable reference voltages is constant throughout operation (i.e. during the calibration and the conversion) of the A/D converter. This reference voltage, designated VA_REF in accordance with FIG. 1, is used as base reference voltage during the calibration. In the example as shown in FIG. 1, the constant base reference voltage VA_REF is formed by the reference voltage VREF0.

The calibration network 2 which is shown in FIG. 1 and is intended for use with a plurality of freely selectable reference voltages differs from the conventional solution, explained above on the basis of FIG. 2, concerning the use of a common calibration network for the correction both of offset errors and of linearity errors merely by virtue of the fact that those reference elements or capacitors 20 to which the selected positive reference voltage VREF=VA_REF is applied at the zero point are split, i.e. it is necessary to provide a corresponding capacitor for offset calibration and a corresponding capacitor for linearity calibration. Since it is assumed below, for the reasons described above, that the zero point of the calibration network 2 is represented by the digital m-bit data word '1000 . . . 000', it is thus the case in accordance with FIG. 1 that only the capacitor $20_{m-1}$ corresponding to the most significant bit (MSB) of said data word is split into the capacitors $20_{OFF}$ and $20_{LIN}$. However, if the zero point were represented by the data word '1100 . . . 000', for example, the capacitor $20_{m-2}$ shown in FIG. 1 would also have to be split into two separate capacitors, etc.

The circuitry with the two separate calibration capacitors $20_{OFF}$ and $20_{LIN}$ ensures that an offset error can be correctly compensated for with the aid of the capacitor $20_{OFF}$ (in combination with the further capacitors of the calibration network 2) and a linearity error can be correctly compensated for with the aid of the capacitor $20_{LIN}$ (in combination with the further capacitors of the calibration network 2). Since the calibration network 2 is provided for the compensation both of offset errors and of linearity errors, it is necessary to distinguish between offset calibration and linearity calibration in the determination of the corresponding correction or calibration values.

Since the negative reference voltage V_GND is assumed to be constant, the remaining calibration capacitances behave analogously to the above description and, accordingly, need not be considered in any further detail below.

The sequence of the calibration with the aid of the calibration network 2 shown in FIG. 1 is as follows.

For the offset calibration, the comparator 3 is firstly switched into the sample mode already mentioned so that the comparator 3 stores the voltage present at the node 6. During the sample phase, the capacitor $20_{OFF}$ is connected up by the controller 5 in such a way that the old offset correction value is present on said capacitor. By contrast, the switch 21 assigned to the capacitor $20_{LIN}$ is switched in such a way that this capacitor is at its zero point value, since the linearity calibration is not permitted to be active. In this case, in principle, any arbitrary value can be applied to the capacitor $20_{LIN}$ as long as it is ensured that this value is constant in the sample phase and in the subsequent decision phase of the comparator 3. In the sample phase, depending on the logic level of the old offset correction value that is present, the remaining capacitors $20_{m-2}$ . . . $20_0$ of the calibration network 2 are connected up to the base reference voltage VA_REF (the corresponding bit is set) or to V_GND (the corresponding bit is not set). Afterward, the comparator 3 is switched into the decision or conversion mode, in order to determine the new offset correction value. In this phase, the base reference voltage VA_REF is applied to the capacitor $20_{OFF}$ in order to operate said capacitor at the offset zero point. As has already been mentioned, the capacitor $20_{LIN}$ remains at its linearity zero point. The other capacitors $20_{m-2}$ . . . $20_0$ are all switched to V_GND in this phase. Depending on the result of the comparator 3, the controller 5 then determines a new offset correction value and stores it in the memory 31.

For the linearity calibration, in the sample mode of the comparator 3, firstly, the voltage (VA_REF or V_GND) corresponding to the old offset correction value is applied to the capacitor $20_{OFF}$, while VA_REF is applied to the capacitor $20_{LIN}$, in order to operate the capacitor at the linearity zero point. In the subsequent decision or conversion phase of the comparator 3, the capacitor $20_{OFF}$ is switched back into the offset zero point, i.e. VA_REF is applied, and the voltage (VA_REF or V_GND), corresponding to the old stored linearity correction value is applied to the capacitor $20_{LIN}$. Depending on the comparator result, the linearity correction value determined according to the preceding conversions is then increased or decreased by the controller 5 and stored as new correction value in the memory 30. The further capacitors $20_{m-2}$ . . . $20_0$ of the calibration network 2 are connected either to VA_REF or to V_GND both during the sample phase and during the decision phase in accordance with the logic level of the old linearity correction value that is present. In principle, instead of VA_REF, any other arbitrary, temporally constant voltage can also be applied to the capacitor $20_{LIN}$ during the sample and redistribution mode and to the capacitors $2_{m-2}$ . . . $20_0$ during the redistribution mode.

In order that the calibration values determined correctly compensate for the actual offset and linearity errors even with the use of a reference voltage that deviates from the calibration voltage VA_REF, the combined calibration network 2 must be connected up as follows in the individual phases of a normal conversion operation in accordance with its original function as offset or linearity error compensation.

During the sample phase of a conversion, the reference voltage VREF selected for the current measurement is applied to the capacitor $20_{LIN}$ in order to operate the capacitor $20_{LIN}$ at the linearity zero point for the selected reference voltage. In this case, this reference voltage may, in particular, deviate from the reference voltage VA_REF used during the calibration. By contrast, in accordance with the old offset correction value either VA_REF or V_GND is applied to the capacitor $20_{OFF}$ and the further capacitors $20_{m-2}$ . . . $20_0$. In the subsequent charge redistribution phase, the switch configuration is reversed, i.e. the fixed reference voltage VA_REF is then applied in a constant fashion to the capacitor $20_{OFF}$ in order to operate the latter at the offset zero point, and, depending on the logic level of the linearity correction value, either VREF (for a set bit) or V_GND (for a non-set bit) is applied to the capacitor $20_{LIN}$ and the capacitors $20_{m-2}$ . . . $20_0$.

On account of the matching of the offset correction values to the reference voltage VREF respectively selected, in principle any arbitrary reference voltage can be used and, moreover, freely selected for each conversion, without influencing the basic function of the calibration. Apart from residual errors (noise, system inherent disturbances, etc.) which cannot be compensated for by the calibration, the conversion results that can thus be obtained are free of offset and linearity errors.

Although the invention has been described above using capacitor networks 1 and 2, it is expressly pointed out that other types of reference elements, in particular resistors, can also be used.

We claim:

1. An apparatus for measuring a ratio of one voltage to another voltage, comprising:

a converter having a conversion device for converting an analog input signal into a digital output signal, or converting a digital input signal into an analog output signal, with respect to a specific reference voltage, said converter having a means for measuring a ratio of an input voltage to a non-constant reference voltage.

2. The apparatus according to claim 1, wherein said conversion device comprises a main network with a plurality of weighted reference elements and an output, and a comparator connected to said output of said main network, and a correction network with weighted further reference elements is coupled to said main network for correcting offset errors and linearity errors, and wherein said reference elements of said main network are assigned correction values for driving said correction network.

3. The apparatus according to claim 2, which comprises a main network controller for setting a voltage to be applied in each case to said reference elements of said main network, and a correction network controller for setting a voltage to be applied in each case to said reference elements of said correction network.

4. The apparatus according to claim 3, wherein at least one reference voltage of the plurality of reference voltages applied to said reference voltage selection device is a temporally constant reference voltage, and said correction network controller applies the temporally constant reference voltage to said correction network as a base reference voltage for correcting offset errors and linearity errors.

5. The apparatus according to claim 4, wherein said correction network is allocated a specific zero point at which said correction network controller applies in each case either the base reference voltage or a negative reference voltage to said individual weighted reference elements of said correction network.

6. The apparatus according to claim 5, wherein all said reference elements of said correction network to which the base reference voltage is applied at the zero point are divided into a corresponding offset reference element for correcting offset errors and into a corresponding linearity reference element for correcting linearity errors, and said all other reference elements in said correction network are not split into reference elements used exclusively for correcting offset errors and reference elements used exclusively for correcting linearity errors.

7. The apparatus according to claim 6, wherein said main network is configured to convert the input signal according to the principle of charge redistribution, and said weighted reference elements in said main network and said correction network are capacitors, said correction network controller is configured to, during a conversion of said converter, in a sample phase thereof, apply either the base reference voltage or the negative reference voltage to said at least one offset reference element and the other reference elements of said correction network depending on a previously determined offset correction value and to apply a reference voltage, which is currently selected by said reference voltage selection device, to said at least one linearity reference element, while in a subsequent charge redistribution phase of the converter, the base reference voltage is applied to the at least one offset reference element and either the reference voltage, which is currently selected by the reference voltage selection device, or the negative reference voltage is applied to said at least one linearity reference element and also the other reference elements of said correction network depending on a previously determined linearity correction value.

8. The apparatus according to claim 6, wherein said correction network controller, during a conversion by said converter, in a sampling phase in said converter, respectively applies either a base reference voltage or a negative reference voltage to said at least one offset reference element and to said other reference elements of said correction network depending on a previously determined offset correction value, and applies a reference voltage currently selected by said reference voltage selection device to said at least one linearity reference element, said correction network controller, in a subsequent charge redistribution phase in said converter, applying said base reference voltage to said at least one offset reference element and applying a voltage selected from the group consisting of said reference voltage currently selected by said reference voltage selection device and said negative reference voltage to said at least one linearity reference element and to said other reference elements in said correction network based on a previously ascertained linearity correction value.

9. The apparatus according to claim 5, wherein the zero point of said correction network is defined such that the base reference voltage is applied only to a most significant reference element of said correction network by said correction network controller at the zero point, while the negative reference voltage is applied to all other reference elements of said correction network at the zero point.

10. The apparatus according to claim 9, wherein said correction network controller, for a correction of offset errors, fixedly applies the base reference voltage to at least one linearity reference element, while in a sample phase of said comparator, the base reference voltage or the negative reference voltage is applied to at least one offset reference element and the other reference element of said correction network depending on a previously determined offset correction value, and, in a decision phase of said comparator the base reference voltage is applied to the at least one offset reference element and the negative reference voltage is applied to the other reference elements of said correction network, the comparator storing the voltage present at a node between said main network and said correction network in the sample phase and performing a comparison and outputting a result of the comparison in the decision phase, said correction network controller outputting a new offset error value in dependence on the results of the comparison.

11. The apparatus according to claim 9, wherein said correction network controller, for a correction of linearity errors, in a sample phase of the comparator applies the base reference voltage or the negative reference voltage to at least one offset reference element and the other reference elements of the correction network depending on a previously determined offset correction value and applies the base reference voltage to at least one linearity reference element, while in a decision phase of the comparator, the base reference voltage is applied to said at least one offset reference element and either the base reference voltage or the negative reference voltage is applied to said at least one linearity reference element and also the other reference elements of said correction network depending on a previously determined linearity correction value, and wherein said comparator stores a voltage present at a node between said main network and said correction network in the sample phase and performs a comparison and outputs a result of the comparison in the decision phase, said correction network controller outputting a new linearity correction value in dependence on the results of the comparison.

12. The apparatus according to claim 2, wherein said main network is configured to convert the input signal according to the principle of charge redistribution, and said weighted reference elements in said main network and said correction network are capacitors.

13. The apparatus according to claim 12, wherein said correction network controller, during a conversion by said converter, in a sampling phase in said converter, respectively applies either a base reference voltage or a negative reference voltage to said at least one offset reference element and to said other reference elements of said correction network depending on a previously determined offset correction value, and applies a reference voltage currently selected by said reference voltage selection device to said at least one linearity reference element, said correction network controller, in a subsequent charge redistribution phase in said converter, applying said base reference voltage to said at least one offset reference element and applying a voltage selected from the group consisting of said reference voltage currently selected by said reference voltage selection device and said negative reference voltage to said at least one linearity reference element and to said other reference elements in said correction network depending on a previously determined linearity correction value.

14. The apparatus according to claim 1, wherein said conversion device has an internal reference voltage selection device receiving a plurality of reference voltages and selecting, in dependence on a selection signal, one of the reference voltages and applying said one of the reference voltages to said conversion device.

15. The apparatus according to claim 14, wherein said selection device comprises a multiplexer.

16. The apparatus according to claim 15, wherein said multiplexer is connected to a digital data bus for supplying the selection signal.

17. The apparatus according to claim 1, wherein said digital output signal is a signal having several bits.

18. An analog/digital or digital/analog converter, comprising:
    a conversion device converting an analog or digital input signal into a digital or analog output signal with respect to a particular reference voltage, said conversion device having:
        a main network containing a plurality of weighted reference elements and a comparator connected to an output of said main network;
        a correction network containing further weighted reference elements coupled to said main network for correcting both offset errors and linearity errors, said reference elements in said main network having associated correction values for actuating said correction network, said correction network having a particular associated zero point at which a correction network controller applies a first reference voltage to particular reference elements in said correction network and applies a second reference voltage to other reference elements in said correction network; and
    said particular reference elements in said correction network being split into a corresponding offset reference element for correcting offset errors and into a corresponding linearity reference element for correcting linearity errors, and said all other reference elements in said correction network not being split into reference elements used exclusively for correcting offset errors and reference elements used exclusively for correcting linearity errors.

19. The apparatus according to claim 18, wherein said particular reference voltage and said first reference voltage have the same magnitude.

20. The apparatus according to claim 18, wherein said particular reference voltage and said first reference voltage have a different magnitude.

21. A method for operating an analog/digital or digital/analog converter, which comprises the following steps:
    providing an apparatus according to claim 18;
    applying either the first reference voltage or the second reference voltage, respectively, during a conversion by the converter, in a sampling phase in the converter, to the at least one offset reference element and to the other reference elements in the correction network depending on a previously determined offset correction value;
    applying the reference voltage with respect to which the input signal to the conversion device is converted by the conversion device, to at least one linearity reference element;
    in a subsequent charge redistribution phase in the converter, applying the reference voltage with respect to which the input signal to the conversion device is converted by the conversion device to the at least one offset reference element; and
    applying either the reference voltage, with respect to which the input signal to the conversion device is converted by the conversion device, or the second reference voltage to the at least one linearity reference element and to the other reference elements in the correction network depending on a previously determined linearity correction value.

22. A method for measuring a ratio of a first voltage to a second voltage using an analog/digital or digital/analog converter, which comprises:
    providing a converter having a conversion device for converting an analog input signal into a digital output signal, or converting a digital input signal into an analog output signal, with respect to a specific reference voltage; and
    measuring with the converter the ratio of a input voltage to a non-constant reference voltage.

23. The apparatus according to claim 22, wherein said digital output signal is a signal having several bits.

* * * * *

UNITED STATES PATENT AND TRADEMARK OFFICE
CERTIFICATE OF CORRECTION

PATENT NO. : 6,720,896 B2
DATED : April 13, 2004
INVENTOR(S) : Joseph Semmler et al.

It is certified that error appears in the above-identified patent and that said Letters Patent is hereby corrected as shown below:

Column 12,
Line 25, should read as follows: -- correction value in dependence on the results of the comparison. --

Signed and Sealed this

Tenth Day of August, 2004

JON W. DUDAS
*Acting Director of the United States Patent and Trademark Office*